United States Patent
Hansen

(10) Patent No.: US 8,120,376 B2
(45) Date of Patent: Feb. 21, 2012

(54) FAULT DETECTION APPARATUSES AND METHODS FOR FAULT DETECTION OF SEMICONDUCTOR PROCESSING TOOLS

(75) Inventor: Keith John Hansen, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 582 days.

(21) Appl. No.: 11/955,148

(22) Filed: Dec. 12, 2007

(65) Prior Publication Data

US 2009/0153144 A1  Jun. 18, 2009

(51) Int. Cl.
*G01R 31/02* (2006.01)
*G01R 31/26* (2006.01)

(52) U.S. Cl. .................. 324/762.01; 324/555

(58) Field of Classification Search .............. 324/511, 324/500, 555, 765, 763, 762.01
See application file for complete search history.

(56) References Cited

U.S. PATENT DOCUMENTS

| | | | |
|---|---|---|---|
| 3,870,953 A * | 3/1975 | Boatman et al. ............ 324/72.5 |
| 5,233,191 A * | 8/1993 | Noguchi et al. ............... 850/1 |
| 5,864,773 A * | 1/1999 | Barna et al. ................... 702/85 |
| 6,439,447 B1 * | 8/2002 | Minamitani et al. ......... 228/104 |
| 6,788,991 B2 | 9/2004 | De Haas et al. |
| 6,788,992 B2 * | 9/2004 | Ono ............................... 700/121 |
| 6,799,378 B2 | 10/2004 | Schopf et al. |
| 6,900,877 B2 | 5/2005 | Raaijmakers |
| 6,950,774 B2 | 9/2005 | Donald |
| 7,063,981 B2 | 6/2006 | Bondestram et al. |
| 7,235,806 B2 | 6/2007 | Beginski et al. |
| 7,595,467 B2 * | 9/2009 | Yang et al. .................... 219/508 |
| 2004/0030419 A1 * | 2/2004 | Miyasaka et al. ............. 700/32 |
| 2006/0107898 A1 | 5/2006 | Blomberg |
| 2007/0269596 A1 | 11/2007 | Shero et al. |
| 2008/0002832 A1 * | 1/2008 | Chen et al. ...................... 381/56 |
| 2009/0093906 A1 | 4/2009 | Takizawa et al. |
| 2009/0252580 A1 | 10/2009 | Takizawa et al. |

* cited by examiner

*Primary Examiner* — Hoai-An D Nguyen
(74) *Attorney, Agent, or Firm* — Knobbe, Martens, Olson & Bear, LLP

(57) ABSTRACT

Fault detection apparatuses and methods for detecting a processing or hardware performance fault of a semiconductor production tool have been provided. In an exemplary embodiment, a method for detecting a fault of a semiconductor production tool includes sensing a signal associated with a test component of the production tool during operation of the production tool and converting the signal to an electronic test signal. A prerecorded signature signal corresponding to the test component is provided and the test signal and the prerecorded signature signal are compared.

34 Claims, 3 Drawing Sheets

FAULT DETECTION APPARATUSES AND METHODS FOR FAULT DETECTION OF SEMICONDUCTOR PROCESSING TOOLS

FIELD OF THE INVENTION

The present invention generally relates to semiconductor processing, and more particularly relates to fault detection apparatuses and methods for detecting processing or hardware performance faults of semiconductor processing tools.

BACKGROUND OF THE INVENTION

The ability to quickly determine the root cause of processing faults, such as particle contamination, film non-uniformity, wafer placement errors or other faults, in the production of a semiconductor wafer is confounded by the number of possible defect sources and the random wafer paths within the tool. For example, it is not uncommon to find aluminum particles on periodic particle qualification monitor wafers after processing in a semiconductor processing tool. However, because a large percentage of the tool may consist of aluminum, it is very time consuming to find the source of the aluminum particles using present troubleshooting methods.

One present-day method for detecting faults in the processing of wafers by a semiconductor production tool in a device fabrication facility is the periodic testing of the tool using test wafers. This testing method typically is performed at predetermined cycles, for example, every four to eight hours. However, between testings the fault may become catastrophic, that is, an unacceptable number of production wafers may become contaminated or otherwise damaged. Thus, the production yield could be significantly reduced before the fault is detected.

Other methods for fault detection in a tool include "wafer-based unit operation regression testing", which requires a wafer to be tested after every step of a process flow, and "causal magnification", which requires components of the tool to be operated in isolation a number of times, for example, the opening and closing of a valve a number of times, to identify the component of the tool causing the faulty condition. However, these and other methods consume a lot of time, wafers and other resources, and in many cases are not successful. If unsuccessful, then wholesale replacement of multiple components may be required to identify and resolve the problem. The longer the production tool is out of operation, the more costly the problem becomes.

Accordingly, it is desirable to provide methods for detecting a processing fault of a semiconductor fabrication or processing tool during early stages of the fault onset. In addition, it is desirable to provide fault detection apparatuses for semiconductor fabrication or processing tools that are capable of detecting processing faults efficiently. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for detecting a fault of a semiconductor production tool is provided. The method comprises the steps of sensing a signal associated with a test component of the production tool during operation of the production tool, converting the signal to an electronic test signal, and providing a prerecorded signature signal corresponding to the test component. The test signal and the prerecorded signature signal are compared.

In accordance with another exemplary embodiment of the present invention, a method for detecting a fault of a semiconductor production tool is provided. The method comprises the steps of recording and storing a signature signal corresponding to a test component of the semiconductor production tool, mounting at least one detection device so that it is capable of sensing a signal from the test component, operating the semiconductor production tool, and sensing a signal produced by the test component during operation of the semiconductor production tool and converting that signal to a data spectrum. The signature signal is compared to the data spectrum, and a fault detection signal is produced based on results of the comparison of the signature signal and the data spectrum.

In accordance with an exemplary embodiment of the present invention, a fault detection apparatus for a semiconductor production tool is provided. The fault detection apparatus comprises a detection device configured to sense a signal from a test component of the semiconductor production tool and produce a test signal corresponding to the signal. The fault detection apparatus also comprises a signature signal database that stores a signature signal corresponding to operation of the test component in a known state, and a comparator in electrical communication with the detection device and the signature signal database. The comparator is configured to compare a test signal received from the detection device and a signature signal received from the signal database.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
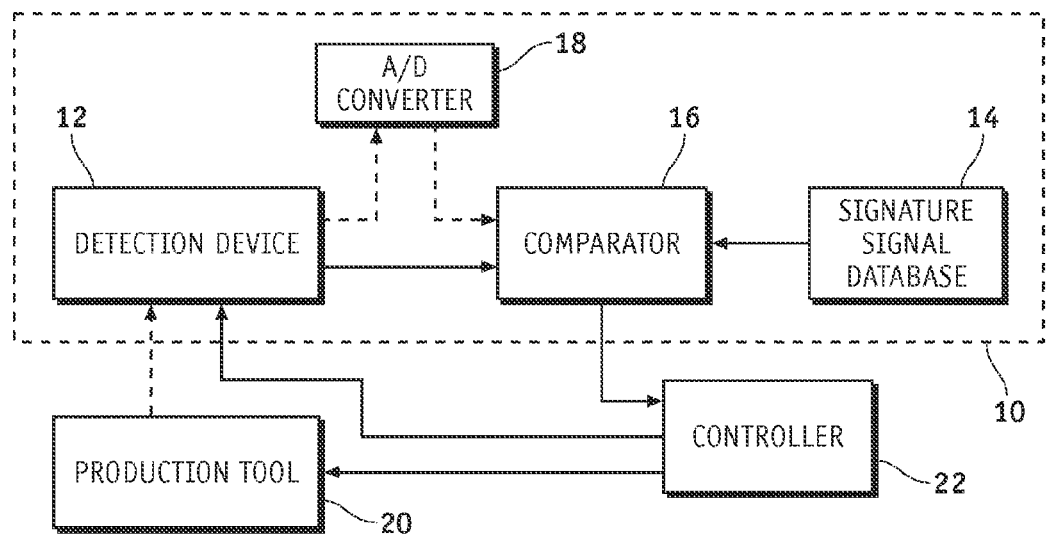
FIG. 1 is a block diagram schematically illustrating a fault detection apparatus in accordance with an exemplary embodiment of the present invention.

Referring to FIG. 1, in accordance with an exemplary embodiment of the present invention, a fault detection apparatus 10 is configured for the monitoring of a semiconductor wafer or IC (integrated circuit) fabricating or processing tool, hereinafter referred to as "production tool", 20 and indicating when a fault in the operation of that tool has occurred. The production tool 20 may comprise any suitable fabrication or processing tool, such as, for example, a cleaning tool, a strip or etch tool, a vapor deposition tool, a sputtering tool, an electroplating tool, an annealing tool, a chemical mechanical polishing (CMP) tool, a wafer handling robot, and the like. The novel fault detection apparatus 10 comprises a detection device 12, a signature signal database 14, and a comparator 16.

The detection device 12 of fault detection apparatus 10 comprises a sensor or other device that is capable of sensing an acoustic, vibration or rotation, strain, optical, or thermal signal from a production tool component or mechanism being monitored (hereinafter, the "test component") and transmitting that signal as an electronic signal (hereinafter, the "test signal") to a comparator 16, to be described in more detail below. Acoustic detection devices suitable for use in the fault detection apparatus 10 of the present invention include, but are not limited to, fiber optic acoustic detectors, stethoscopes, laser microphones, and piezoelectric pressure sensors. Vibration and rotation detection devices suitable for use in the fault detection apparatus 10 of the present invention include, but are not limited to, piezoelectric, capacitance, null-balance, strain gage, resonance beam, piezoresistive, magnetic induction, laser interferometric, accelerometer, gyroscopic, and microelectromechanical system (MEMS) sensors. The vibration detection devices can have from one axis to three axes of measurement, the multiple axes typically being orthogonal to each other. Strain detection devices suitable for use include, but are not limited to, fiber Bragg gratings, stimulated Brillouin scattering sensors, and polarimetry sensors for birefringent materials. Optical detection devices suitable for use include, but are not limited to, chemical (absorption and fluorescence spectroscopy), strain, biomedical, electrical and magnetic, and rotation types of sensors. The optical detection devices may comprise intensity or interferometric sensors. Thermal detection devices suitable for use include, but are not limited to, remote pyrometers, Fabry-Pérot interferometers, Raman scattering sensors, and fluorescence monitors. Preferably, the detection device is selected specifically for the type of test component to be monitored, e.g., a vacuum valve, a spindle, a motor, etc., and the environment within which the test component operates, e.g., within a vacuum, within a fluid, at extreme temperatures, and the like. For example, if arcing in a plasma chamber is to be monitored, a photodetector may be used to detect changes in light wavelengths within the chamber and convert those changes to an electronic signal spectrum. Any suitable number of detection devices may be used to monitor the test component. For example, if a valve of a processing chamber is to be monitored, a first stethoscope, comprising an electronic microphone coupled to a metal rod, may be mounted onto the valve's actuator and a second stethoscope may be mounted onto the valve seal plate. The metal rods would pick up and transfer mechanical vibrations from the valve to the microphones, where the mechanical vibrations would be converted to electronic signal spectrums.

The detection device may be configured for direct mounting onto the component or may be configured for remote monitoring. For example, if a wafer handling robot is to be monitored, it may be difficult to physically mount a sensor onto the robot because the robot may move within a chamber and/or between two or more chambers. In this regard, a remotely-mounted laser microphone could be used to transmit a laser beam to the robot to detect any vibration of the robot and covert the vibration to an electronic signal spectrum. In an exemplary embodiment of the invention, the detection device can be mounted to the test component any time during or after installation of the production tool. In another exemplary embodiment, the detection device can be mounted to the test component before fabrication and installation of the production tool. For example, a test component can be manufactured and sold as a "smart" component equipped with the detection device already mounted thereon.

As described above, the fault detection apparatus 10 also comprises a signature signal database 14. The signature signal database 14 is a database configured to store signature signals for the production tool test components. A "signature signal" is a digital data spectrum that has been previously recorded from a test component(s) operating in a known state. The signature signal may correspond to a properly functioning state or a malfunctioning state. The spectrum that comprises the signature signal may be a frequency measured over time, an intensity measured over distance, an intensity measured over an x-y grid or other such spectra. In one exemplary embodiment of the invention, the signature signal is recorded from the same, or a similar type of, test component operating in isolation. In a preferred embodiment, the signature signal is recorded from the same, or a similar type of, test component operating within the same, or a similar type of, production tool, under substantially the same conditions that the test component is to operate under in the production tool. Preferably, the signature signal is recorded using the same type of detection device that is used to monitor the test component. The signature signal can be recorded in any suitable digital file format, such as, for example, an audio interchange file format (AIFF) used to store digital audio waveform data, a WAV file format, a text file, and the like. The signature signal database may store signature signals for one or more test components of the production tool.

The fault detection apparatus 10 further comprises a comparator 16 that is configured to receive the test signal from the detection device monitoring the test component and to compare the test signal to a signature signal of the test component. In an embodiment in which the signature signal corresponds to a properly operating state of the test component, if the comparator determines that the test signal and the signature signal are substantially different, either in frequency, amplitude or waveform, the comparator may produce a signal, referred to as a "fault detection signal", indicating that the component is not operating properly. In another embodiment in which the signature signal corresponds to a malfunctioning state of the test component, if the comparator determines that the test signal and the signature signal are substantially the same, the comparator may produce a fault detection signal as defined above. In a preferred embodiment of the invention, the comparator may be an off-the-shelf speech recognition software program, such as ViaVoice® manufactured by IBM of Armonk, N.Y., or Dragon™ NaturallySpeaking manufactured by Nuance Communications of Burlington, Mass., that resides on any suitable hardware platform. It will be appreciated that the fault detection apparatus also may comprise an analog-to-digital (A/D) converter 18 that is capable of converting analog signals from the detection device 12 to digital signal spectra suitable for analysis by the comparator 16. The comparator 16 may be configured to receive signals from only one detection device or from a plurality of detection devices monitoring one or more test components in a production tool.

In another exemplary embodiment of the invention, a controller 22 may be used to receive the fault detection signal from the comparator 16 and perform a suitable task. The controller 22 may comprise, for example, such common elements as microprocessors, read only memory (ROM), random access memory (RAM), electrically programmable read-only memory (EPROM), high speed clock, analog to digital (A/D) and digital to analog (D/A) circuitry, and input/ output (I/O) circuitry and devices and appropriate signal conditioning and buffer circuitry. The controller 22 may be a stand-alone module separate from the fault detection system 10 or may be a part thereof. For example, the signature signal database 14, the comparator 16, and/or the A/D converter may reside as part of the controller 22.

In an exemplary embodiment of the invention, the controller 22 may comprise hardware and software capable of monitoring and recording the various parameters of the processes performed within and by the production tool. For example, the controller 22 may monitor and record the temperature and/or pressure within a chamber(s) of the production tool, the setpoints of valves of the production tool, voltage inputs, wafer handling robot positions, platform rotational speeds, and the like. In a preferred embodiment of the invention, the controller 22 also is configured with suitable hardware and software to be capable of controlling or determining when the production tool is in operation. In this manner, the detection device or devices used to monitor the production tool can be activated by the controller 22 to monitor the test components only when the production tool is operating and/or only when the test components are operating. Accordingly, the detection device 12 will not send irrelevant data that may overwhelm the comparator 16 and/or the controller 22.

In another exemplary embodiment of the invention, the controller 22 may comprise suitable hardware and software so that the controller is capable of determining the cause of the test signal. For example, a detection device 12 such as a photodetector may detect light wavelengths in a plasma chamber that are indicative of arcing and transmit a test signal to a comparator. When the comparator compares the test signal to the signature signal for a properly functioning plasma, determines that the signals vary substantially, and transmits a fault detection signal to the controller, the controller can monitor the voltage ramp-up used to ignite the plasma in the plasma chamber and determine if an excessively high voltage ramp-up is resulting in the arcing. In another example, a piezoelectric sensor may detect a non-standard acoustic signature from a cryogenic pump that is knocking and transmit a test signal to a comparator. When the comparator compares the test signal to the signature signal for a malfunctioning pump, determines that the signals are substantially the same, and transmits a fault detection signal to the controller, the controller may be capable of determining if moisture present in the helium atmosphere of the pump is the cause of knocking.

In a further exemplary embodiment of the invention, the controller 22 may comprise suitable hardware and software so that the controller can perform various tasks. In one exemplary embodiment of the invention, upon receipt of a fault detection signal from the comparator, the controller 22 can produce a visual or audible signal indicating that the production tool is operating improperly. In this manner, operation of the production tool can be manually or automatically terminated. In another exemplary embodiment of the invention, the controller can perform various diagnostic tests or analyze process parameters to determine the cause of the production tool processing fault. In a further exemplary embodiment of the invention, the controller can take remedial action to eliminate the processing fault by changing one or more tool parameters controlling its operation. It will be appreciated that one or any combination of these tasks can be performed by one or more controllers 22.

An example of a controller in a preferred embodiment of the invention may be the Athena™ software platform that is available for some processing tools manufactured by Novellus Systems Inc. of San Jose, Calif. The fault detection apparatus 10 may interface with the Athena Knowledge Base™ in the Athena platform, which includes statistical process control, equipment fault monitoring and notification, sensor integration and remote connectivity for diagnostics.

Figure 2:
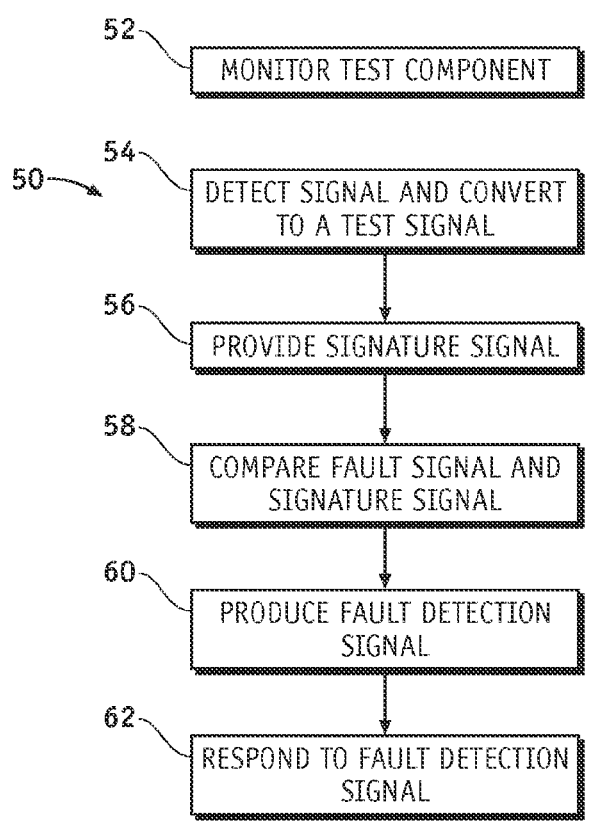
FIG. 2 is a flowchart of a method for detecting processing faults of a semiconductor fabrication or processing tool.

FIG. 2 is a flowchart of a method 50 for detecting a processing fault of a semiconductor processing tool. The method 50 comprises the step of monitoring the test component (step 52). In this regard, the detection device is activated to monitor the test component at a predetermined sampling rate. The sampling rate is high enough so that a suitable fidelity is obtained to detect a fault if one is occurring but is low enough to prevent an excessive amount of data from overloading the comparator or otherwise adversely affecting the performance of the comparator or controller. In a preferred embodiment of the invention, the sampling rate is no less than 48 kHz. In a more preferred embodiment of the invention, the sampling rate is no less than 60 Hz and is no greater than 600 kHz. As described above, the detection device can monitor the test component continuously or, preferably, can be activated by a controller or other computer module to monitor the test component only when the production tool is operating or, alternatively, only when the test component is operating in the production tool. By monitoring the acoustic, vibration or rotation, strain, optical or thermal signal produced by the test component at a suitable sampling rate, a processing fault can be detected near its onset before a significant amount of production wafers have been damaged.

Figure 3:
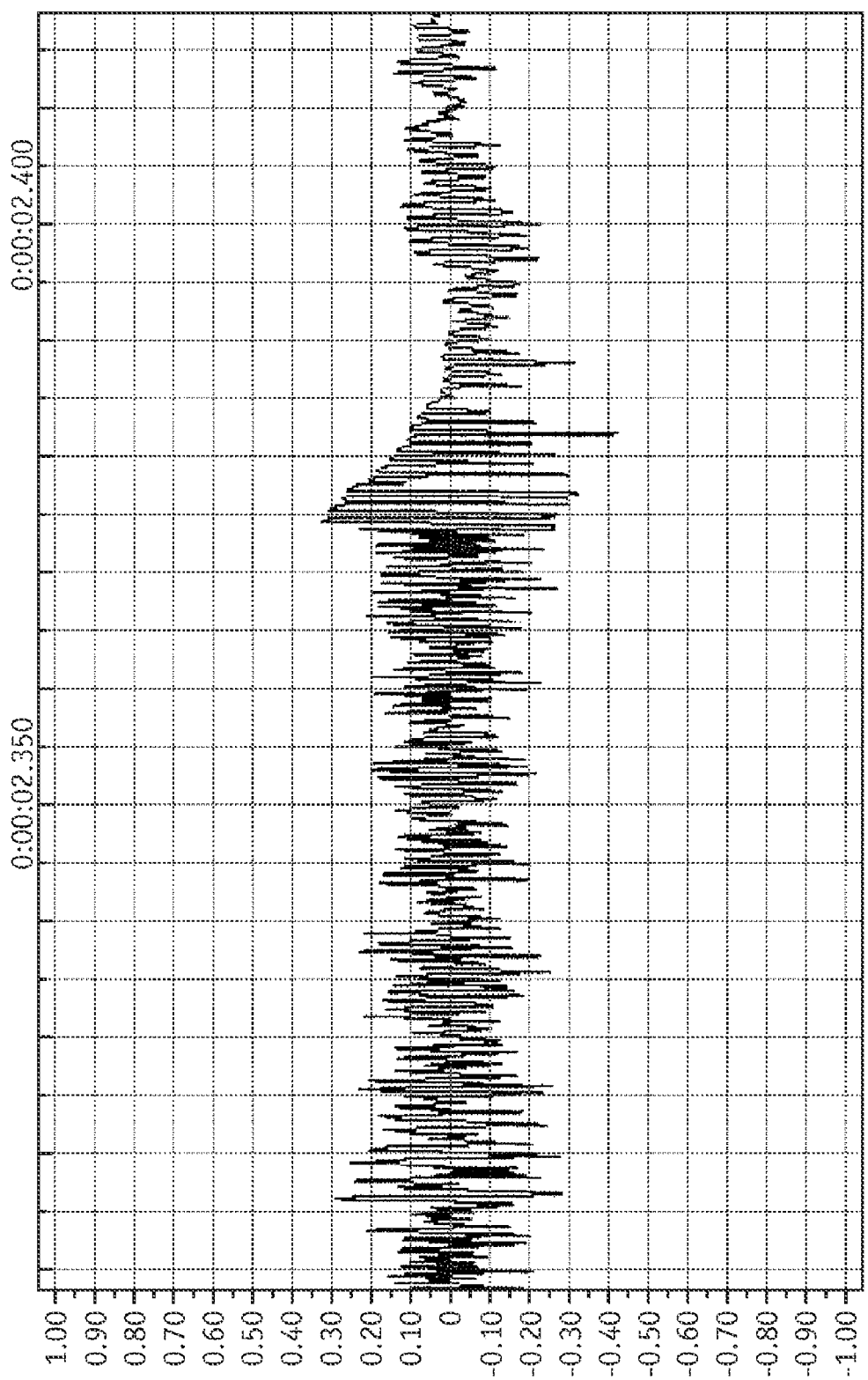
FIG. 3 is an exemplary AIFF electronic test signal generated from acoustic signals sensed by an electronic stethoscope monitoring an improperly-functioning vacuum isolation valve of a wafer transfer system, in accordance with an exemplary embodiment of the present invention.

As described above, the detection device senses acoustic, vibration or rotation, strain, thermal or optical signals, or spectra, produced by the test component and converts that signal to an electronic test signal (step 54). If the electronic signal is an analog signal, the signal can be converted to a digital signal by an A/D converter. In one exemplary embodiment of the invention, once the test signal is produced by the detection device, it can be transmitted to a comparator for real-time analysis. In another exemplary embodiment of the invention, the test signal can be stored in a computer module, such as, for example, a data acquisition port, that resides on or within the production tool or resides at a remote location, such as, for example, on a remote personal computer or laptop computer. In this regard, the test signal data then can be retrieved at a later time for analysis. FIG. 3 is an exemplary electronic test signal generated from acoustic signals sensed by an electronic stethoscope monitoring an improperly-functioning vacuum isolation valve of a wafer transfer system. The acoustic signals were sensed using ViaVoice® sound recognition software available from IBM of Armonk, N.Y. and an audio interchange file format (AIFF) recorder. The sampling rate was 48 kilohertz (kHz).

Figure 4:
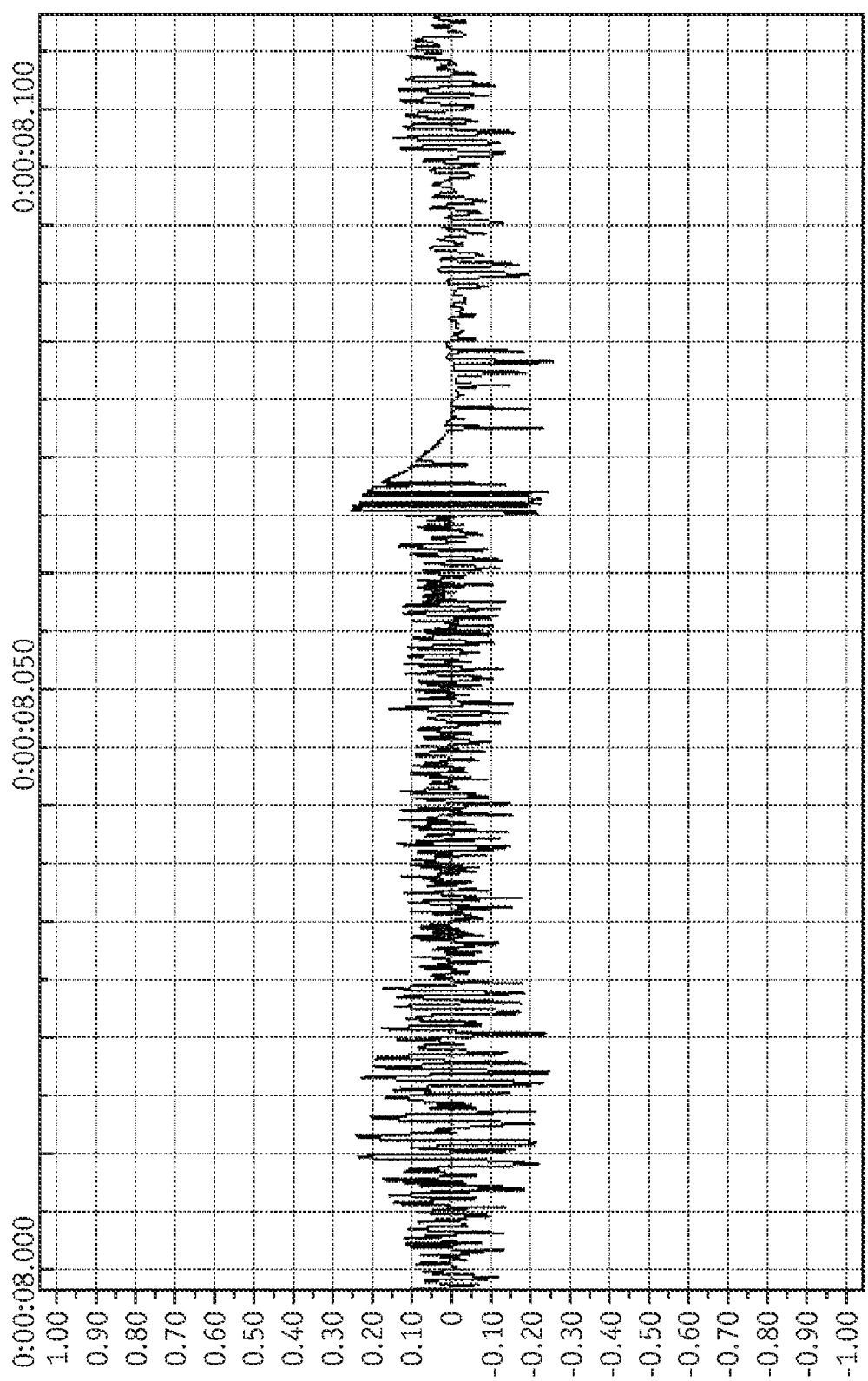
FIG. 4 is an exemplary AIFF electronic signature signal generated from acoustic signals sensed by an electronic stethoscope monitoring a properly functioning vacuum isolation valve of a wafer transfer system, in accordance with an exemplary embodiment of the present invention.

The method 50 continues in accordance with an exemplary embodiment of the invention with the step of providing a signature signal to the comparator (step 56). The signature signal can be stored on a database that resides within the comparator, within a controller, or resides as a stand-alone module. As described above, a "signature signal" is a digital data spectrum that has been previously recorded from a test component(s) operating in a known state, such as a proper operation state or a known failure state. The signature signal can comprise a general signature signal for a type of a test component or can be a signature signal prerecorded during proper operation of the test component itself. In an exemplary embodiment of the invention, the signature signals can be provided with a production tool before installation of the tool so that any damage of the test component of the production tool before or during installation, e.g. during shipment, can be detected. In another exemplary embodiment of the invention, the signature signal can be recorded and stored in the database during or after installation of the production tool. FIG. 4 is an exemplary electronic signature signal generated from acoustic signals sensed by an electronic stethoscope monitoring a properly-functioning vacuum isolation valve of a wafer transfer system. The acoustic signals were sensed using ViaVoice® sound recognition software available from IBM of Armonk, N.Y. and an audio interchange file format (AIFF) recorder. The sampling rate was 48 kHz.

Upon receipt of the test signal and the signature signal, the comparator then compares the signals to determine if they are substantially the same or different in waveform, frequency or amplitude (step 58). If the signature signal corresponds to a properly operational state and the comparator determines that the test signal and the signature signal differ substantially, it produces a fault detection signal (step 60). If the signature signal corresponds to a malfunctioning state and the comparator determines that the test signal and the signature signal are substantially the same, it produces a fault detection signal. As used herein, the term "differ substantially" or "substantially different" means that the comparator determines that the signals differ by at least a predetermined threshold. Likewise, the term "substantially the same" or "substantially equivalent" means that the comparator determines that the signals differ by less than a predetermined threshold. In an exemplary embodiment of the invention, the fault detection signal is a visual, audible, or electronic signal that informs a human operator or a controller that a processing fault is occurring. In this regard, in an optional embodiment, the controller or human operator can respond to the fault detection signal (step 62). For example, the operation of the production tool can terminated manually or automatically so that the test component can be analyzed and the processing fault remedied. In addition, a production wafer or wafers situated in the production tool during the onset of the fault can be discarded, reclaimed, or, if the fault has not become catastrophic, can proceed further in the production process. In another embodiment, a human operator or a controller may respond to the fault detection signal by varying at least one parameter controlling operation of the tool, but not terminating the process.

In another exemplary embodiment, the comparator, controller or operator can determine from the difference or similarity in the test signal and the signature signal the source of the processing fault on the test component. For example, a properly operating cylinder rod sliding through a piston housing may make a vibration at one end of the housing and another vibration at the other end of the housing, with the vibrations separated by a time period associated with that type of piston rod and housing. However, if the test signal indicates that the vibrations of the test piston are separated by a longer period of time than that recorded in the signature signal from a proper operation state, the comparator, or a computer module coupled thereto, can determine that the cylinder rod is not properly sliding through the housing. In another exemplary embodiment of the invention, from the similarities between the test signal and the signature signal from a malfunctioning state, such as, for example, the substantial equivalence in amplitude of the signals, the comparator can determine the severity of the processing fault. The comparator then can provide a fault detection signal to a controller or other computer module or to a computer user interface indicating the source of the processing fault and/or the severity of the processing fault. In another exemplary embodiment, the comparator can provide the test signal and the signature signal, or the difference between to the two signals to a controller or other computer module, which then can determine the source of the processing fault and/or the severity of the processing fault.

Accordingly, fault detection apparatuses for semiconductor processing tools and methods for detecting processing or hardware performance faults of semiconductor processing tools have been provided. The apparatuses and methods provide for the detection of a processing fault early in the onset of the fault so that the fault can be corrected before a significant number of production wafers are damaged. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for detecting a fault of a semiconductor production tool during an operation thereof, the method comprising the steps of:
    sensing a signal associated with a test component of the semiconductor production tool during the operation of the semiconductor production tool;
    converting the signal to an electronic test signal;
    providing a prerecorded signature signal corresponding to the test component, the prerecorded signature signal created prior to the sensing; and
    comparing the test signal and the prerecorded signature signal.

2. The method of claim 1, wherein the step of sensing the signal comprises the step of sensing the signal by at least one detection device associated with the test component.

3. The method of claim 1, wherein the step of sensing the signal comprises the step of sensing an acoustic, vibration or rotation, strain, optical or thermal signal.

4. The method of claim 1, wherein the step of providing the prerecorded signature signal corresponding to the test component comprises the step of prerecording a signal produced by the test component when the test component is operating in a known state.

5. The method of claim 4, wherein the step of prerecording comprises the step of prerecording a signal produced by the test component when the test component is functioning properly.

6. The method of claim 4, wherein the step of prerecording comprises the step of prerecording a signal produced by the test component when the test component is malfunctioning.

7. The method of claim 1, wherein the step of providing the prerecorded signature signal corresponding to the test component comprises the step of prerecording a signal produced by the test component when the test component is operating in isolation.

8. The method of claim 1, wherein the step of providing the prerecorded signature signal corresponding to the test component comprises the step of prerecording a signal produced by the test component when the test component is operating in the semiconductor production tool.

9. The method of claim 1, wherein the step of comparing the test signal and the prerecorded signature signal comprises the step of comparing the test signal to the prerecorded signature signal using voice recognition software.

10. The method of claim 1, wherein the step of comparing the test signal and the prerecorded signature signal comprises the step of comparing the test signal and the prerecorded signature signal in real time.

11. The method of claim 1, further comprising the step of providing a fault detection signal if the test signal substantially differs from the prerecorded signature signal corresponding to a properly operating state.

12. The method of claim 11, wherein the step of providing the fault detection signal comprises the step of providing a visual, audible, or electronic signal that indicates that a fault in the operation of the semiconductor production tool has been detected.

13. The method of claim 11, further comprising the step of terminating operation of the semiconductor production tool after the step of providing the fault detection signal.

14. The method of claim 11, further comprising the step of varying an operational parameter of the semiconductor production tool after the step of providing the fault detection signal.

15. The method of claim 1, further comprising the step of providing a fault detection signal if the test signal is substantially equivalent to the prerecorded signature signal corresponding to a malfunctioning state.

16. The method of claim 15, wherein the step of providing the fault detection signal comprises the step of providing a visual, audible, or electronic signal that indicates that a fault in the operation of the semiconductor production tool has been detected.

17. The method of claim 15, further comprising the step of terminating operation of the semiconductor production tool after the step of providing the fault detection signal.

18. The method of claim 15, further comprising the step of varying an operational parameter of the semiconductor production tool after the step of providing the fault detection signal.

19. A method for detecting a fault of a semiconductor production tool, the method comprising the steps of:
   recording and storing a signature signal corresponding to a test component of the semiconductor production tool;
   mounting at least one detection device so that it is capable of sensing a signal from the test component;
   operating the semiconductor production tool after the step of recording and storing;
   sensing a test signal produced by the test component during operation of the semiconductor production tool;
   comparing the signature signal to the test signal; and
   producing a fault detection signal based on results of the comparison of the signature signal and the test signal.

20. The method of claim 19, wherein the step of mounting at least one detection device so that it is capable of sensing a signal from the test component comprises the step of mounting the at least one detection device on the test component.

21. The method of claim 19, wherein the step of mounting at least one detection device so that it is capable of sensing a signal from the test component comprises the step of mounting the at least one detection device remotely from the test component.

22. The method of claim 19, further comprising the step of terminating operation of the semiconductor production tool after the step of producing the fault detection signal.

23. The method of claim 19, further comprising the step of varying at least one operational parameter of the semiconductor production tool after the step of producing the fault detection signal.

24. The method of claim 19, further comprising the step of determining a severity of a processing fault corresponding to the fault detection signal.

25. The method of claim 19, further comprising the step of determining the cause of a processing fault corresponding to the fault detection signal.

26. The method of claim 19, wherein the step of comparing the signature signal to the test signal comprises the step of comparing the signature signal to the test signal using voice recognition software.

27. A fault detection apparatus for a semiconductor production tool, wherein the fault detection apparatus comprises:
   a detection device configured to sense a signal from a test component of the semiconductor production tool during operation of the semiconductor production tool and produce a test signal corresponding to the signal;
   a signature signal database that stores a signature signal corresponding to operation of the test component in a known state, wherein the signature signal database is created before the detection device senses the signal; and
   a comparator in electrical communication with the detection device and the signature signal database, wherein the comparator is configured to compare the test signal received from the detection device and the signature signal received from the signature signal database.

28. The fault detection apparatus of claim 27, wherein the detection device comprises a fiber optic acoustic detector, a piezoelectric or piezoresistive pressure sensor, a stethoscope, a laser microphone, a photodetector, an atomic force microscope, a laser interferometer, an accelerometer, an absorption or fluorescence spectrometer, a fiber Bragg grating, or a pyrometer.

29. The fault detection apparatus of claim 27, wherein the detection device is configured for mounting directly to the test component or mounting remotely from the test component.

30. The fault detection apparatus of claim 27, wherein the comparator comprises voice recognition software.

31. The fault detection apparatus of claim 27, wherein the comparator is configured to provide a fault detection signal if the test signal and the signature signal corresponding to a properly operating state are substantially different.

32. The fault detection apparatus of claim 27, wherein the comparator is configured to provide a fault detection signal if the test signal and the signature signal corresponding to a malfunctioning state are substantially equivalent.

33. The fault detection apparatus of claim 27, further comprising a controller that is configured to terminate operation of the semiconductor production tool upon receipt of a fault detection signal from the comparator.

34. The fault detection apparatus of claim 27, further comprising a controller that is configured to vary at least one operational parameter of the semiconductor production tool upon receipt of a fault detection signal from the comparator.

* * * * *